(12) United States Patent
Kumar et al.

(10) Patent No.: US 7,540,081 B2
(45) Date of Patent: Jun. 2, 2009

(54) THERMALLY CONDUCTIVE INTERFACE

(75) Inventors: Sundaram Nand Kumar, Schaumburg, IL (US); Gary Garvin Sites, Rancho Cucamonga, CA (US); Bhavik Patel, Bloomingdale, IL (US)

(73) Assignee: American Standard Circuits, Franklin Park, IL (US)

(*) Notice: Subject to any disclaimer, the term of this patent is extended or adjusted under 35 U.S.C. 154(b) by 211 days.

(21) Appl. No.: 11/557,186

(22) Filed: Nov. 7, 2006

(65) Prior Publication Data

US 2007/0113399 A1    May 24, 2007

Related U.S. Application Data

(62) Division of application No. 11/136,125, filed on May 24, 2005.

(51) Int. Cl.
*H05K 3/30* (2006.01)
(52) U.S. Cl. .............................. 29/832; 29/825; 29/830; 165/185
(58) Field of Classification Search .................. 29/825, 29/830, 832, 846; 165/185
See application file for complete search history.

(56) References Cited

U.S. PATENT DOCUMENTS

| 4,574,879 | A |   | 3/1986 | DeGree et al. |       |
|-----------|---|---|--------|---------------|-------|
| 4,602,125 | A |   | 7/1986 | West et al.   |       |
| 4,602,678 | A | * | 7/1986 | Fick ............................ | 165/79 |
| 4,685,987 | A | * | 8/1987 | Fick ............................ | 156/247 |
| 4,810,563 | A | * | 3/1989 | DeGree et al. ............. | 428/209 |
| 4,842,911 | A |   | 6/1989 | Fick          |       |
| 4,852,646 | A |   | 8/1989 | Dittmer       |       |
| 4,869,954 | A |   | 9/1989 | Squitieri     |       |
| 4,907,124 | A |   | 3/1990 | Kaufman       |       |
| 4,960,634 | A |   | 10/1990 | Boyko et al. |       |
| 4,974,119 | A |   | 11/1990 | Martin       |       |
| 4,979,074 | A |   | 12/1990 | Morley et al. |       |
| 5,060,114 | A |   | 10/1991 | Feinberg et al. |     |

(Continued)

OTHER PUBLICATIONS

Furnival, Courtney R., "Thermal and High Current Multilayer Printed Circuit Boards With Thermagon T-lam and Hybrid Boards", Jan. 31, 2001.

(Continued)

*Primary Examiner*—C. J Arbes
(74) *Attorney, Agent, or Firm*—McDonnell Boehnen Hulbert & Berghoff LLP

(57) ABSTRACT

A thermally conductive material is provided as a mixture of a silicone, a ceramic powder, and a curing catalyst. The material may be pre-formed into a pad and each side of the film protected with removable release layers. Each side of the film may also include a coating of an adhesive material that aids in coupling the interface film with a surface. The material may alternatively be produced in a screen-printable paste. As such, a layer of the paste may be screen-printed on a surface as complete sheet form or as a patterned film by using a stencil patterned screen mesh. The interface material is sandwiched between a printed circuit board and a heat sink to form the circuit board assembly. In a multi-step press process, the assembly is cured and a laminate formed. The assembly process may also include a priming function that prepares metal surfaces of the circuit board and heat sink for receiving the interface material.

18 Claims, 3 Drawing Sheets

U.S. PATENT DOCUMENTS

| | | | |
|---|---|---|---|
| 5,213,868 A | | 5/1993 | Liberty et al. |
| 5,463,530 A | * | 10/1995 | DeGree ...................... 361/707 |
| 5,545,473 A | | 8/1996 | Ameen et al. |
| 5,591,034 A | | 1/1997 | Ameen et al. |
| 5,652,055 A | | 7/1997 | King et al. |
| 5,679,457 A | * | 10/1997 | Bergerson ................... 428/344 |
| 5,738,936 A | * | 4/1998 | Hanrahan ................ 428/313.5 |
| 5,766,740 A | | 6/1998 | Olson |
| 5,798,171 A | | 8/1998 | Olson |
| 5,990,550 A | | 11/1999 | Umezawa |
| 6,174,841 B1 | | 1/2001 | Yamada et al. |
| 6,432,497 B2 | | 8/2002 | Bunyan |
| 6,799,628 B1 | | 10/2004 | Masseth et al. |
| 6,852,573 B2 | * | 2/2005 | Ebihara et al. .............. 438/122 |

OTHER PUBLICATIONS

"Thermally Conductive Insulators", T-gon™ 200 Series.
"Sil-Pad® 400", The Original Sil-Pad Material.

* cited by examiner

THERMALLY CONDUCTIVE INTERFACE

This application is a divisional of U.S. patent application Ser. No. 11/136,125, which was filed on May 24, 2005.

BACKGROUND

1. Field

This disclosure relates to thermal interfacing in electronic devices and more specifically relates to using an interface material to adjoin a printed circuit board with a heat sink.

2. Description of Related Art

As electronic components become smaller and more powerful, their heat dissipation requirements also rise dramatically. When an aluminum heat sink is attached to a printed circuit board, an interface must be used that ensure a proper thermal connection. The interface may also serve as an electric insulator.

Historically, both thermal grease and pre-formed interface pads have been used as interfaces. However, the present state of the art can be difficult to work-with, more expensive, and/or unreliable. Therefore, there is a need for an advance in the art of preparing thermal interface material and in manufacturing circuit board assemblies using the interface material.

SUMMARY

This disclosure relates to a thermal interface material and its application in a circuit board assembly. A thermally conductive material is provided as a mixture of a silicone-based compound, a ceramic powder for enhancing thermal conductivity, and an organic curing catalyst. The thermally conductive material may be pre-formed into a film or pad and each side of the film protected with removable release layers. Each side of the film may also include a coating of an adhesive material that aids in coupling the interface film with a metal surface. The thermally conductive material may alternatively be produced in a screen-printable paste. As such, a layer of the thermally conductive paste may be screen-printed on the metal surface. The screen used for printing the paste on the metal surface can be either without any stencil pattern to allow the entire metal surface to be covered with the paste, or the screen can be mask patterned suitably to allow the paste applied in the corresponding pattern form on the metal surface.

The interface material is sandwiched between a printed circuit board and a heat sink to form the circuit board assembly. In a multi-step press process, the assembly is cured and a laminate formed. The multi-step process includes a first pressure treatment applied to the assembly at a room temperature to increase surface contact and to remove air pockets, a second pressure treatment applied to the assembly at a high temperature to cure the interface and create a laminate; and a third pressure treatment applied to the assembly at a low temperature to controllably return the assembly to room temperature. The assembly process may also include a priming function that prepares metal surfaces of the circuit board and heat sink for receiving the interface material.

The interface material may also be used in other applications, such as multi-layer circuits and to fill vias and channels in a circuit board. Further, the material may serve as an interface between a circuit component and a heat sink or other element.

The foregoing as well as other aspects, advantages, and alternatives will become apparent to those of ordinary skill in the art by reading the following detailed description and claims, with reference where appropriate to the accompanying drawings.

DETAILED DESCRIPTION

1. Overview

Figure 1:
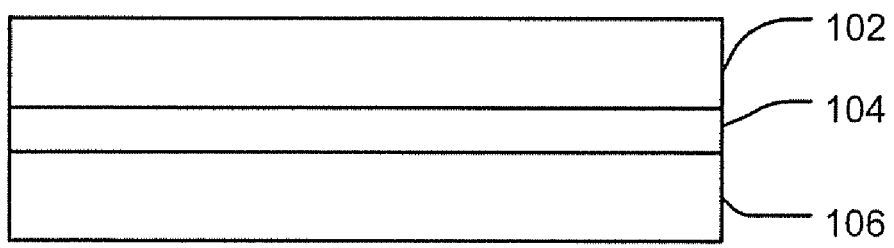
FIG. 1 is a cross-sectional drawing illustrating a circuit board assembly.

Referring to the drawings, FIG. 1 is a diagram illustrating an embodiment of a circuit board assembly. In the assembly, a thermally conductive interface 104 is sandwiched between a circuit board 102 and a heat sink 106. In operation, excess heat generated by components mounted on the circuit board 102 may be shunted through the interface 104 to the heat sink 106.

Generally, the interface 104 is composed of a silicone-based dielectric and ceramic mixture having a low thermal impedance. When cured in a hot-press method, the interface 104 also provides a mechanical bond to help secure the assembly. An organic catalyst is included to aid in the curing process.

The circuit board 102 is a printed (or printable) circuit board (PCB) on which electronic components may be mounted and may include a non-conducting substrate layer, such as a fiberglass layer. In addition, the circuit board 102 may include a metal base layer constructed of copper, for instance.

The heat sink 106 is a metal element, such as an aluminum, brass or copper element configured to receive a heat transfer along a planar side and to release excess heat from its other surfaces. While the heat-sink may be configured as a simple rectangular prism, other configurations that may add additional surface area may be appropriate.

In manufacture, the interface 104 may be applied either as a screen-printable mixture or as a pre-formed laminate.

2. Silicone Based Thermally Conductive Material

In the embodiment described above, the thermally conductive interface is composed of a mixture with a silicone-based compound as the primary ingredient. The silicone-based compound may, for instance, be a dimethyl silicone and/or methyl-poly silicone oxide. Such compounds may be beneficial, as they are easily obtainable and are more resistant to thermal shock than other compounds such as an epoxy.

Ceramic particles are included in the interface mixture to provide thermally conductive properties. Ceramic particles should be selected according to thermal needs of the specific application. Examples of ceramic particles that may be used include aluminum oxide, aluminum nitride, and boron nitride. Of course, a ceramic compound may be selected based on the required thermal properties of the material.

Further, a combination of ceramic compounds may be blended into the silicone-based material to provide alternative thermal properties. In another embodiment, the ceramic particles may be pre-ground to a size of approximately 10 nm.

A softness catalyst is included in the film to control a softness of the film as it is manufactured. For instance, a nickel-based catalyst may be used. Additionally, a curing catalyst may be added to promote and/or control the curing reaction. The curing catalyst may also serve as a hardener. Examples of the curing catalyst may include a peroxide-based or a platinum-based catalyst. A thinning agent may be used to control viscosity of the mixture.

It will be appreciated that other materials may be added to the interface mixture to provide various functionalities. Likewise, materials listed here may be removed or substituted in some situations.

3. Laminate Layer

In certain embodiments, the thermally conductive interface is pre-manufactured (pre-formed) film (laminate) that can be placed between a circuit board and a heat sink during assembly.

Figure 2A:
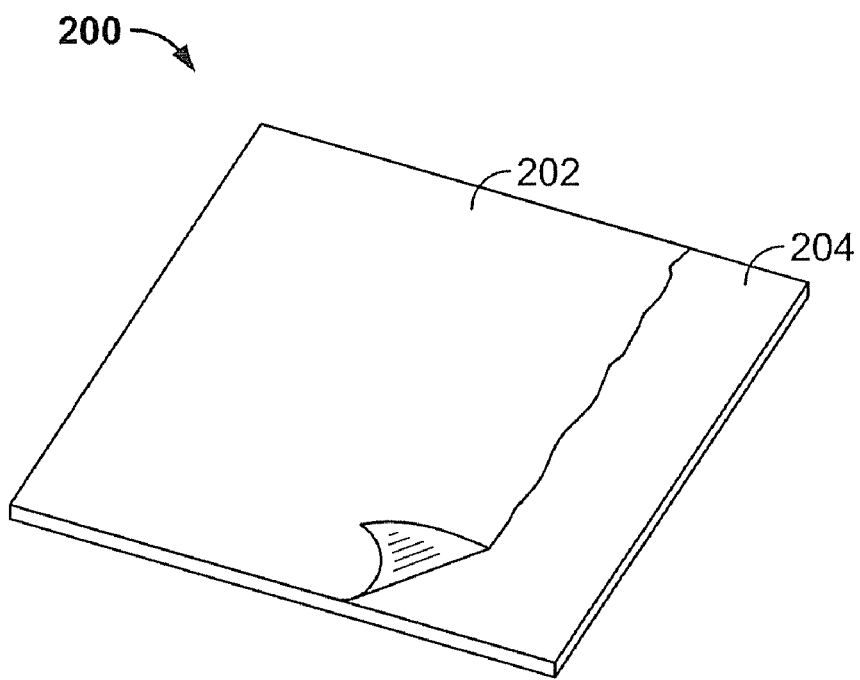
FIG. 2(a) is a perspective view of an interface film in sheet form.

FIG. 2(a) illustrates an embodiment of such an interface film in a protected sheet form. As manufactured, a protected interface film 200 includes the interface film 204, a first release layer 202 protecting a first side of the interface film 204 and a second release layer (not shown) protecting a second side of the interface film 204. In one embodiment, these sheets are sized at approximately 18'×12'×4 mil. In operation, the release layers are removed to reveal the bare interface film 204 prior to placing the film within the circuit board assembly.

Figure 2B:
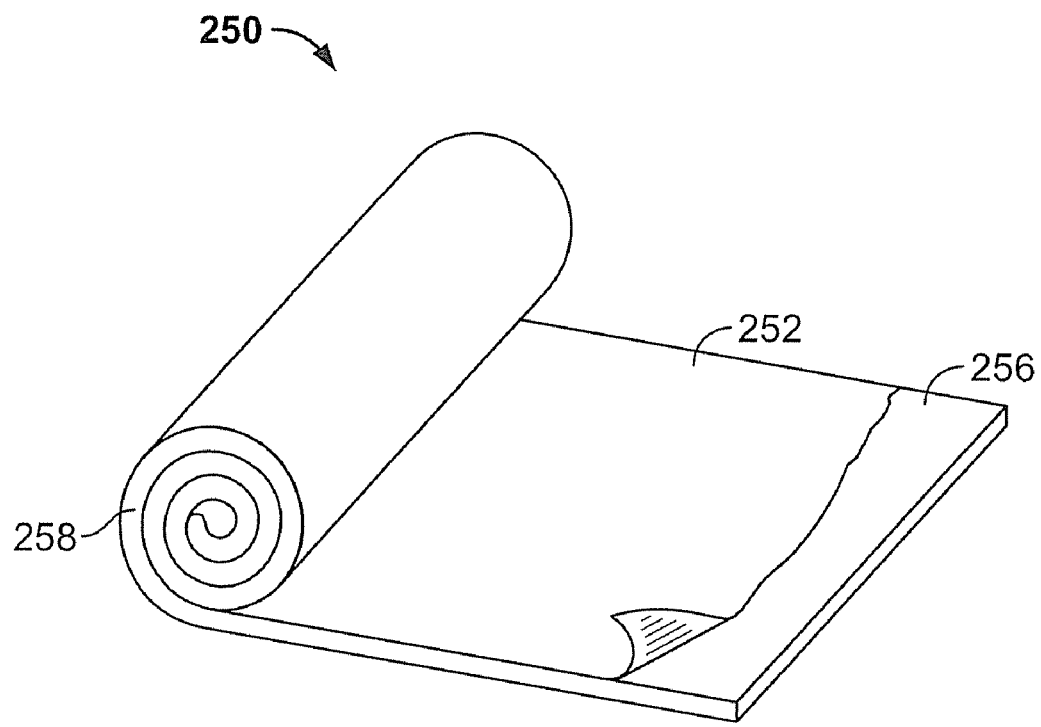
FIG. 2(b) is a perspective view of an interface film in roll form.

FIG. 2(b) illustrates an embodiment of an interface film in a protected roll form. As manufactured a rolled protected interface film 250 includes the rolled interface film 256, a first rolled release layer 252 protecting a first side of the rolled interface film 256 and a second release layer (not shown) protecting a second side of the rolled interface film 256. A roll 258 allows a large amount of interface film to be stored without unduly bending or crimping the film. In operation, a portion of the rolled protected interface film 250 may be unrolled and cut according to manufacturing needs. For purposes of this disclosure, the term "interface film" is defined to include, but is not limited to, sheet form and rolled form.

In certain embodiments, an adhesive is included with the interface film to promote bonding with the metal surfaces of the heat sink and circuit board. In one application, the adhesive is added to the surface of both sides of the interface film prior to application of the release layer. In an alternative application, the adhesive is added to the interface mixture prior to forming it as a film.

4. Lamination Process

Figure 3:
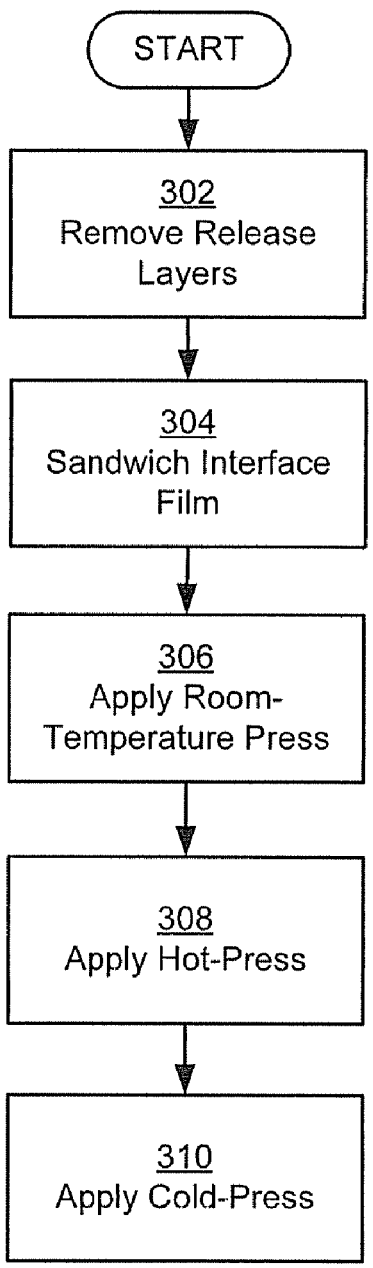
FIG. 3 is a flowchart illustrating a process flow for a process of manufacturing a circuit board assembly using pre-manufactured interface film.
Figure 4:
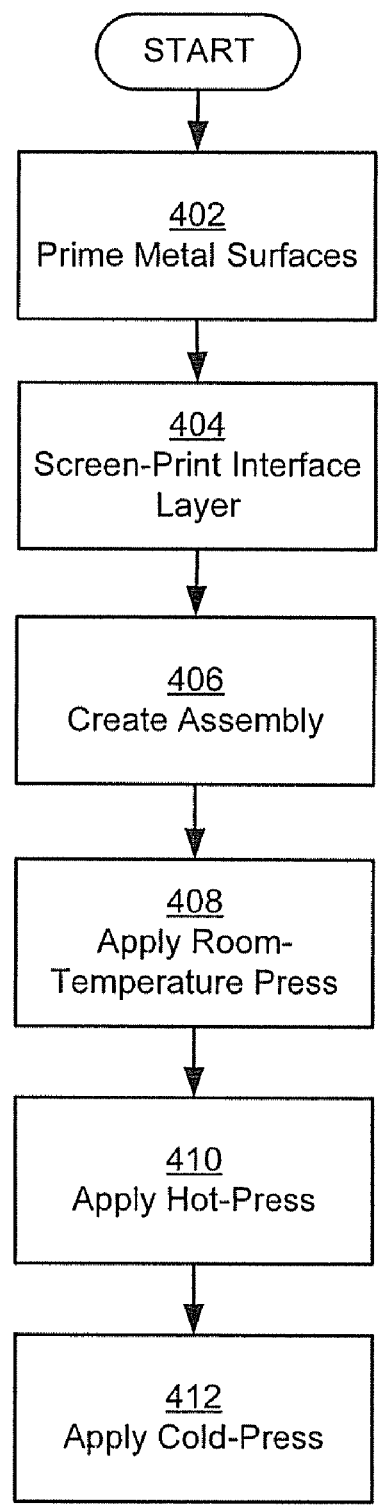
FIG. 4 is a flowchart illustrating a process flow for a process of manufacturing a circuit board assembly using an interface material in a screen-printable paste form.

FIG. 3 illustrates a process flow for manufacturing a circuit board assembly with a pre-manufactured interface film, such as those describe above. At block 302, the release layers are removed from each side of the interface film to expose the film. At block 304, the interface film is then sandwiched between the circuit board and the heat sink. Although FIG. 3 shows block 302 occurring prior to block 304, in other embodiments these steps may be executed in an intertwined fashion. This intertwined fashion may include removing a first release layer from a first side of the interface film, then pressing the exposed side against a planar side of the heat sink. Once the interface film is (e.g., loosely) attached to the heat sink, the second release layer is removed to expose a second side of the interface film. The circuit board is then pressed against the second side to form the sandwich assembly shown in FIG. 1. Of course, in another embodiment, the intertwined function may be reversed so that the interface film is first attached to the circuit board and then attached to the heat sink. At this point, the surfaces of the interface film are pliable and, therefore, allow a high rate of surface contact.

Once the sandwich assembly is formed, at block 306, a room-temperature pressure treatment is applied to the assembly—pressing the heat sink toward the circuit board. In operation, it is expected that this pressure treatment may be applied using a roller-assembly or any other number of mechanisms. The room-temperature pressure treatment works to (i) substantially remove any air-pockets that could reduce thermal conductivity and create 'hot spots' in the assembly and (ii) increase surface contact at the circuit board/film boundary as well as the heat sink/film boundary.

At block 308, a high-temperate pressure treatment is applied to the assembly—again pressing the heat sink toward the circuit board. The high-temperature press is intended to promote curing of the interface film as well as bonding of the interface film to the adjacent metal. Typically, the high-temperature bond may operate at a temperature of approximately 330 degrees Fahrenheit and a pressure of approximately 150 psi for approximately 20 minutes. Of course these parameters may vary according to a number of factors, such as the thickness and composition of the interface layer and the particular requirements of any curing catalyst used. In a further embodiment, the high-temperature pressure treatment includes application of a temperature of at least 320 degrees Fahrenheit and pressure of at least 140 psi for at least 20 minutes.

At 310, a low-temperature pressure treatment is applied to the assembly—again pressing the heat sink toward the circuit board. According to the exemplary embodiment, the low-temperature pressure treatment is applied immediately following the high-temperature pressure treatment. The low-temperature may be room-temperature or another value at or below room temperature. In a further embodiment, the low-temperature is not a fixed temperature, but is a temperature that is reduced over time during the low-temperature pressure treatment.

In the high-temperature pressure treatment, the silicone matrix forms cross-links that are hardened/cured. The low-temperature pressure treatment cools the interface down to room temperature under pressure without letting any air trap between the bonded layers. This may reduce the occurrence of delamination of the bonded layers. Once the assembly is cooled, circuit components may be assembled on the circuit board. In certain embodiments, the low-temperature pressure treatment is performed at a pressure of approximately 40 psi for approximately 10 minutes.

In a further embodiment, the circuit board has a metal base (such as a copper or aluminum base) that is attached directly to the interface film. Likewise, a planar surface of the heat sink is attached to the other side of the interface film.

Prior to attaching the circuit board and heat sink to the interface film, it may be appropriate to prepare the metal surfaces—thus helping to ensure better adhesion to the film. The preparation may include, for instance, degreasing, desmutting, physical roughening and chemical roughening of the metal surface and then cleaning the surface with alcohol and/or applying a thin coat of a primer material. This conditions the surface for better adherence to the material.

In a further embodiment, the primer material may be a chromate primer. (e.g., chromic acid). In another embodiment, anodizing the planar surface of the heat sink may serve to prepare the surface for binding with the interface film.

In an exemplary embodiment, the end result of the lamination process is that the circuit board assembly becomes a single element—the interface film bonded securely with both the metal bottom of the PCB and the planar surface of the heat sink. In some cases, excess interface material from an edge of the assembly may be trimmed.

5. Screen-Printing Process

In another exemplary embodiment, the thermally conductive mixture is provided in a screen-printable paste form. The screen printable form may provide a lower cost mechanism for creating a thermally conductive interface between the circuit board and the heat sink.

FIG. 3 provides an exemplary process flow for manufacturing the circuit board assembly with the thermally conductive mixture in screen-printable paste form. At block 402, the metal surfaces of the circuit board and heat sink are cleaned and primed.

As described above, this may include degreasing, desmutting, physical roughening and chemical roughening of the metal surface and then cleaning the surface with alcohol and/or applying a thin coat of a primer material.

At block 404 an interface layer is screen printed onto one of the metal surfaces. According to various embodiments, either the metal base of the printed circuit board or the planar surface of the heat sink receives the screen printed layer. The screen printing may be adjusted to apply various layer thicknesses and pattern according to manufacturing specifications. In addition, the screen printing may be patterned to avoid artifacts in the circuit board such as vias and posts, for instance. The screen patterning technique includes stencil formation of a pattern on the screen. In a further embodiment, the screen-printing step is repeated until the interface layer is a desired thickness. The screen printing can be performed manually or by a screen printing machine.

At block 406 the interface layer is then sandwiched between the circuit board and the heat sink to create the assembly.

Once the sandwich assembly is formed, at block 408, a room-temperature pressure treatment is applied to the assembly—e.g., pressing the heat sink toward the circuit board. In operation, it is expected that this room-temperature pressure treatment may be applied using a roller-assembly or any number of other mechanisms (as may the other pressure treatments). The room-temperature pressure treatment works to (i) substantially remove any air-pockets that could reduce thermal conductivity and create 'hot spots' in the assembly and (ii) increase surface contact at the circuit board/film boundary as well as the heat sink/film boundary. Of course, the room temperature pressure treatment may provide other benefits as well.

At block 410, a high-temperate pressure treatment is applied to the assembly—again pressing the heat sink toward the circuit board. The high-temperature press is intended to promote curing of the interface film as well as bonding of the interface film to the adjacent metal. Typically, the high-temperature bond may operate at a temperature of approximately 330 degrees Fahrenheit and a pressure of approximately 150 psi for approximately 20 minutes. Of course, these parameters may vary according to a number of factors, such as the thickness and composition of the interface layer and the particular requirements of any curing catalyst used. In a further embodiment, the high-temperature pressure treatment includes application of a temperature of at least 320 degrees Fahrenheit and pressure of at least 140 psi for at least 20 minutes.

At block 412, a low-temperature pressure treatment is applied to the assembly—again pressing the heat sink toward the circuit board. According to the exemplary embodiment, the low-temperature pressure treatment is applied immediately following the high-temperature pressure treatment. Once the assembly is cooled, circuit components may be assembled on the circuit board. For this embodiment, the low-temperature pressure treatment is accomplished at approximately 40 psi for approximately for 10 minutes or until the assembly is properly cooled.

6. Alternative Embodiments

Figure 5:
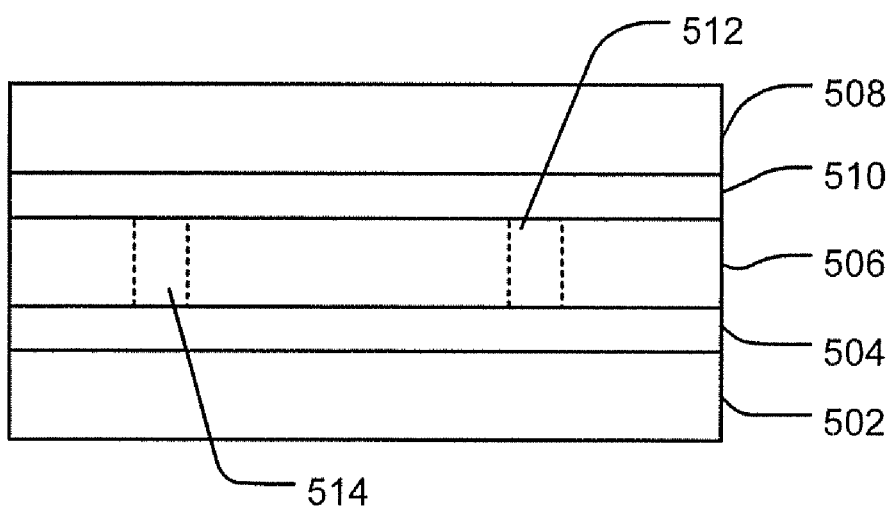
FIG. 5 is a simplified schematic diagram illustrating application of the interface material in a multilayer assembly.

Of course, the silicone-based thermal interface as described may be useful in more applications than those specifically described in the examples above. For instance, FIG. 5 illustrates a multilayer circuit board using such a thermal interface. FIG. 5 illustrates a multilayer printed circuit board with multiple layers 508, 506 that are separated by a first thermal interface 510. Thermal vias 514, 512 may thermally couple the first thermal interface 510 with a second thermal interface 504, where the second thermal interface 504 is further coupled with a heat sink 502.

In the embodiment of FIG. 5, the thermal interface layers 504, 510 may be either pre-manufactured thermal interface films or screen-printed thermal interface layers. Filling the vias 514, 512 may be accomplished via screen-printing, injection, or other mechanical methods. Of course, FIG. 5 is a simplified embodiment. Other embodiments may include a greater number of thermal vias, as well as more circuit board layers. The thermal interface may also be useful to fill thermal channels that, for instance, shunt heat to an edge of the circuit board. The thermal channels may be filled in a similar fashion as the thermal vias. In a double-sided circuit board, the thermal interface may also be used to shunt heat to a heat sink.

In yet another embodiment, the thermal interface material may be used to couple an electronic component directly to a heat sink. For instance, the thermal interface may be used to couple a processor, an electric motor, or a power source directly with a heat sink.

7. Material Properties

Typical data for a four mil thermal silicone film is provided in Table 1. The results shown in Table 1 are a summary of data obtained from test results performed on a preformed thermally conductive layer constructed in accordance with an exemplary embodiment.

TABLE 1

| Test Method | Property | Value |
| --- | --- | --- |
| ASTM D374 | Thickness | 4 mil. |
| ASTM D412 | Tensile Strength | 500 psi |
| ASTM D2240 | Hardness (Shore A) | 73 |
| ASTM D412 | Elongation | 250% |
|  | Continuous Use Temperature | −40 to 450 Degrees Fahrenheit |
| ASTM D5470 | Thermal Conductivity | 0.37 W/m-k |
| ASTM D257 | Electrical Volume Resistivity | $10^{12}$–$10^{13}$ Ohm-cm |
|  | Bond Strength | 15 to 16 PPI |
|  | Specific Gravity | 1.43 |

Of course, other embodiments may be constructed to achieve alternative results. For instance, a thermal film may be manufactured with any thickness ranging from two mil to two-hundred mil. According to a preferred embodiment, it is important to maintain a substantially uniform thickness across a manufactured film in order to ensure a strong bond with the circuit board and heat sink.

Thermal conductivity of an interface film is a function of the particular combination of ceramic powders added to the mixture. Typical ceramic powders that may be used include aluminum oxide, aluminum nitride, and boron nitride. Boron nitride may provide better heat conductivity, although a combination of powder types may also be beneficial. Of course, these listed ceramic powders are only given by way of example, and other materials may be used. Depending upon the ceramic powder(s) selected and the quantity of that powder(s), a thermal conductivity of the film may be increased to approximately 2.5 W/m-k.

8. Conclusion

While a number of exemplary aspects and embodiments have been discussed above, it will be appreciated that certain modifications, additions, permutations and sub-combinations thereof can be made. It is therefore intended that the following appended claims and claims hereafter introduced are interpreted to include all such modifications, permutations, additions and sub-combinations as are within their true spirit and scope.

We claim:

1. A method of manufacturing a circuit board assembly having improved heat dissipation functionality comprising:
   providing a thermally conductive, electrically non-conducting interface film including: a first side and a second side wherein the interface includes resilient silicone, a ceramic powder for enhancing thermal conductivity, an organic curing catalyst, a first release layer protecting a first side, and a second release layer protecting a second side;
   sandwiching the interface between a metal base layer of a printable circuit board and a planar side of a heat sink to form the assembly;
   in a mechanism for applying pressure, applying a first pressure treatment to the assembly at a room temperature to increase surface contact and to remove air pockets;
   applying a second pressure treatment to the assembly at a high temperature to cure the interface and create a laminate; and
   applying a third pressure treatment to the assembly to controllably return the assembly to room temperature.

2. The method of claim 1, wherein the resilient silicone is a dimethyl silicone.

3. The method of claim 1, wherein the ceramic powder includes a ceramic selected from the group consisting of aluminum oxide; aluminum nitride; and boron nitride.

4. The method of claim 1, wherein the interface film further includes:
   a first adhesive applied to the first side; and
   a second adhesive applied to the second side.

5. The method of claim 1, wherein the second pressure treatment includes application of at pressure of at least 140 psi at a temperature of at least 320 degrees Fahrenheit for at least 20 minutes.

6. The method of claim 1, further comprising: trimming excess interface material from an edge of the assembly.

7. The method of claim 1, wherein the interface film has a pre-laminate thickness of between 2 and 200 mils.

8. The method of claim 1, wherein the interface film has a pre-laminate thickness of approximately 4 mils.

9. A method of manufacturing a circuit board assembly having improved heat dissipation functionality comprising:
   screen-printing a thermally conductive, electrically non-conductive interface layer onto a first planar surface of one of a printable circuit board and a heat sink, wherein the interface layer comprises a mixture of dimethyl silicone, a ceramic powder for enhancing thermal conductivity, and a curing catalyst;
   sandwiching the interface layer between a the first planar surface and a second planar surface of the remaining one of the printable circuit board and the heat sink to form the assembly;
   applying a first pressure treatment to the assembly at a room temperature to increase surface contact and to remove air pockets;
   applying a second pressure treatment to the assembly at a high temperature to cure the interface and create a laminate; and
   applying a third pressure treatment to the assembly at a low temperature to controllably return the assembly to room temperature.

10. The method of claim 9, wherein the second pressure treatment includes application of at pressure of at lease 140 psi at a temperature of at least 320 degrees Fahrenheit for at least 20 minutes.

11. The method of claim 9, wherein the third pressure treatment includes application of at pressure of approximately 40 for at approximately 10 minutes.

12. The method of claim 9, wherein the second pressure treatment includes application of at pressure of approximately 150 psi at a temperature of at approximately 330 degrees Fahrenheit for at approximately 20 minutes.

13. The method of claim 9, prior to screen-printing the interface layer, cleaning, surface roughening and applying a primer to the planar surface of the printable circuit board.

14. The method of claim 9, by which film is applied in a continuous form or as a stencil patterned format, further comprising: repeating the screen-printing function a predetermined number of times to achieve a desired interface thickness.

15. The method of claim 9, wherein the organic curing catalyst is a peroxide.

16. The method of claim 9, wherein the ceramic powder includes a ceramic selected from the group consisting of aluminum oxide; aluminum nitride; and boron nitride.

17. The method of claim 9, further comprising: trimming excess interface material from an edge of the assembly.

18. The method of claim 8, wherein the dimethyl silicone is a methyl-poly silicone oxide.

* * * * *